(12) United States Patent
Chan

(10) Patent No.: US 6,441,435 B1
(45) Date of Patent: Aug. 27, 2002

(54) SOI DEVICE WITH WRAP-AROUND CONTACT TO UNDERSIDE OF BODY, AND METHOD OF MAKING

(75) Inventor: Darin A. Chan, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/773,037

(22) Filed: Jan. 31, 2001

(51) Int. Cl.[7] .................. H01L 27/01; H01L 27/12; H01L 31/0392
(52) U.S. Cl. .................. 257/347; 257/353; 257/354
(58) Field of Search .................. 257/345, 347, 257/349, 352–354, 382–384

(56) References Cited

U.S. PATENT DOCUMENTS

| | | |
|---|---|---|
| 5,317,181 A | 5/1994 | Tyson |
| 5,889,306 A * | 3/1999 | Christensen et al. ........ 257/350 |
| 5,945,712 A * | 8/1999 | Kim ............................ 257/252 |
| 5,965,917 A | 10/1999 | Maszara et al. |
| 5,994,738 A | 11/1999 | Wollesen |
| 5,998,840 A | 12/1999 | Kim |
| 6,111,293 A * | 8/2000 | Liao ........................... 257/347 |
| 6,160,291 A * | 12/2000 | Imai ........................... 257/347 |

* cited by examiner

Primary Examiner—Carl Whitehead, Jr.
Assistant Examiner—Jamie L. Brophy
(74) Attorney, Agent, or Firm—Renner, Otto, Boisselle & Sklar, LLP

(57) ABSTRACT

A transistor device on an SOI wafer includes a metal connect that is in contact with an underside (a bottom surface) of a body of the device. A part of the metal connect is between an active semiconductor region of the device and an underlying buried insulator layer. The metal connect is also in contact with a source of the device, thereby providing some electrical coupling between the source and the body, and as a result reducing or eliminating floating body effects in the device. A method of forming the metal interconnect includes etching away part of the buried insulator layer, for example by lateral etching or isotropic etching, and filling with metal, for example by chemical vapor deposition.

19 Claims, 5 Drawing Sheets

SOI DEVICE WITH WRAP-AROUND CONTACT TO UNDERSIDE OF BODY, AND METHOD OF MAKING

BACKGROUND OF THE INVENTION

1. Technical Field

The present invention relates generally to semiconductor-on-insulator (SOI) devices and methods of making, and more specifically to SOI transistor devices having body contacts.

2. Description of the Related Art

Conventional or bulk semiconductor devices are formed in semiconductor material by implanting a well of either P-type or N-type conductivity silicon in a silicon substrate wafer of the opposite conductivity. Gates and source/drain diffusions are then manufactured using commonly known processes. These form devices known as metal-oxide-semiconductor (MOS) field effect transistors (FETs). When a given chip uses both P-type and N-type, it is known as a complimentary metal oxide semiconductor (CMOS). Each of these transistors must be electrically isolated from the others in order to avoid shorting the circuits. A relatively large amount of surface area is needed for the electrical isolation of the various transistors. This is undesirable for the current industry goals for size reduction. Additionally, junction capacitance between the source/drain and the bulk substrate and "off" state leakage from the drain to the source both increase power consumption. Junction capacitance also slows the speed at which a device using such transistors can operate. These problems result in difficulties in reducing the size, power consumption, and voltage of CMOS technology devices.

In order to deal with the junction capacitance and "off state" leakage problem as well as obtain reduced size, semiconductor-on-insulator technology (SOI) has been gaining popularity. A SOI wafer may be formed from a bulk silicon wafer by using conventional oxygen implantation techniques to create a buried oxide layer at a predetermined depth below the surface. The implanted oxygen oxidizes the silicon into insulating silicon dioxide in a gaussian distribution pattern centered at the predetermined depth to form the buried oxide layer. Field effect transistors formed on SOI substrates also may be able to achieve higher speed operation with higher drive currents, when compared with FETs formed on conventional bulk silicon substrates.

However, one problem with forming field effect transistors on an SOI wafer is the floating body effect. The floating body effect occurs because the buried oxide layer isolates the body of the transistor from the fixed potential silicon substrate and therefore the body takes on charge based on recent operation of the transistor. The floating body effect causes the threshold voltage for operating the transistor to fluctuate, which in turn causes the current-to-voltage curve for the transistor to distort or kink. This problem is particularly apparent for passgate devices such as those used in dynamic random access memory (DRAM) wherein it is critical that the threshold voltage remain fixed such that the transistor remains in the "off" position to prevent charge leakage from the storage capacitor.

One way of controlling floating body effects is to make a body contact, an electrical contact to the body that can be tied to an external voltage source. One known method of making a body contact is to extend the body to a relatively large area beyond a gate. An example of such a body contact is shown in U.S. Pat. No. 5,317,181, to Tyson. However, a body contact arrangement such as that disclosed in Tyson disadvantageously requires a relatively large amount of space on the chip.

An alternative body contact is that described in U.S. Pat. No. 5,965,917, to Maszara et al., wherein a metal conductor directly contacts the sides of both a source or drain and a body of a transistor device, thereby providing a body contact that can be used to control floating body effects. However, the arrangement described in Maszara et al. requires the body to extend to the side of an active silicon region of the transistor, fully under the source or drain. Thus it cannot be used where the source and drain extend fully down to a buried insulator layer.

Accordingly, there is a strong need in the art for a body contact that does not include the disadvantages of the prior art devices.

SUMMARY OF THE INVENTION

A transistor device on an SOI wafer includes a metal connect that is in contact with an underside (a bottom surface) of a body of the device. A part of the metal connect is between an active semiconductor region of the device and an underlying buried insulator layer. The metal connect is also in contact with a source of the device, thereby providing some electrical coupling between the source and the body, and as a result reducing or eliminating floating body effects in the device. A method of forming the metal interconnect includes etching away part of the buried insulator layer, for example by lateral etching or isotropic etching, and filling with metal, for example by chemical vapor deposition.

According to an aspect of the invention, a semiconductor-on-insulator (SOI) device includes a semiconductor substrate; an insulator layer over the semiconductor substrate; an active semiconductor region over the insulator layer, the active semiconductor region including a source, a drain, and a body between the source and the drain; and a metal connector, wherein part of the metal connector is directly in contact with the body and is interposed between the insulator layer and at least part of the body.

According to another aspect of the invention, a semiconductor-on-insulator (SOI) device includes a semiconductor substrate; an insulator layer over the semiconductor substrate; an active semiconductor region over the insulator layer, the active semiconductor region including a source, a drain, and a body between the source and the drain, wherein the source extends from a top surface of the active layer to a bottom surface of the active layer; and a metal connector, wherein part of the metal connector is directly in contact with the source and the body along the bottom surface, and wherein the metal conductor is not in contact with the substrate.

According to yet another aspect of the invention, a method of forming a semiconductor-on-insulator (SOI) device includes the steps of forming a source, a drain, and a body in an active semiconductor region atop an insulator layer of an SOI wafer; and forming a metal connector having a part between the insulator layer and at least part of the active region.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

A transistor device on an SOI wafer includes a metal connect which is in direct contact with the undersides (bottom surfaces) of a source and a body of the device. The metal connect wraps around a side surface of the source and partially between an active semiconductor region of the device and an underlying buried insulator layer. The metal connect provides some electrical coupling between the source and the body, thereby reducing or eliminating floating body effects in the device.

Figure 1:
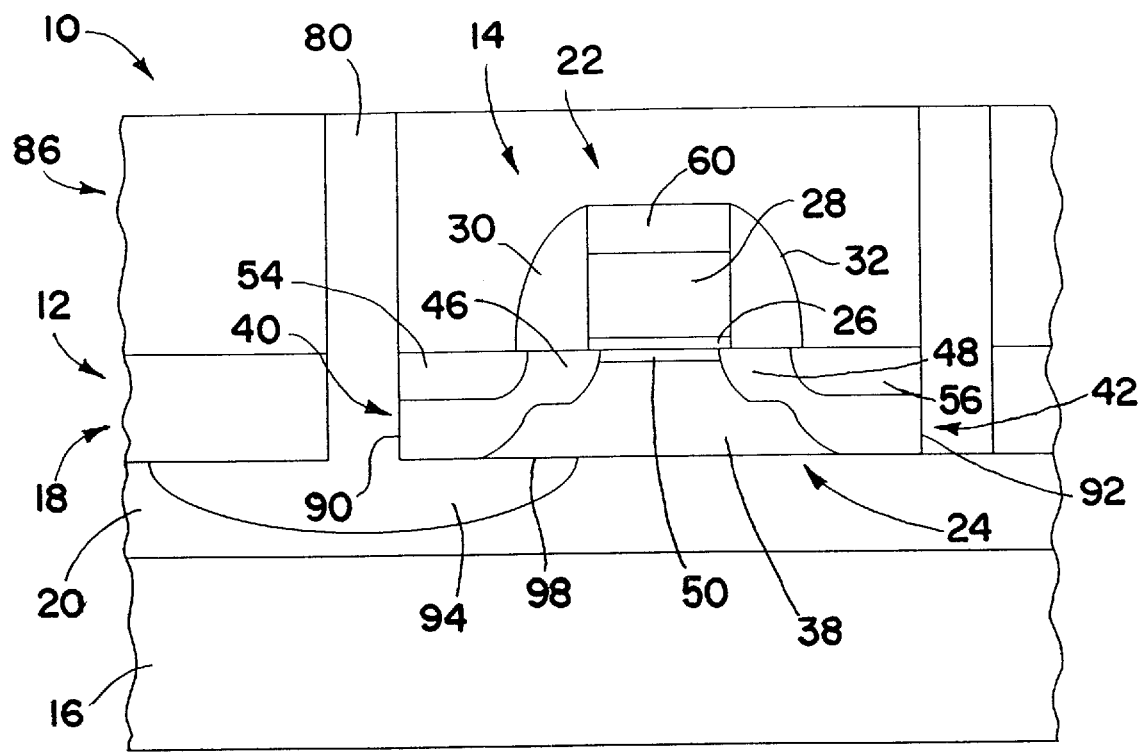
FIG. 1 is a cross-sectional view of a semiconductor device in accordance with the present invention.

Referring initially to FIG. 1, a semiconductor device 10 includes an SOI wafer 12 with a transistor 14 formed thereupon. The SOI wafer 12 includes a semiconductor substrate 16 and a surface semiconductor layer 18, with a buried insulator layer 20 therebetween. The semiconductor substrate 16 and the surface semiconductor layer 18 may be made of silicon, and the buried insulator layer 20 may be made of a silicon oxide such as $SiO_2$, although it will be appreciated that other suitable materials may be used instead or in addition.

The transistor 14 includes a gate 22 formed on an active semiconductor region 24 of the surface semiconductor layer 18. The gate 22 includes a gate dielectric 26 and a gate electrode 28. In addition, spacers 30 and 32 are on respective opposite sides of the gate 22. Exemplary materials for the gate dielectric 26 are $SiO_2$ and $Si_3N_4$. The gate electrode 28 may be made of polysilicon or another semiconductor, or may be made in whole or in part of metal. An exemplary material for the spacers 30 and 32 is SiN.

The active region 24 includes a body 38, with a source 40 and a drain 42 on respective opposite sides of the body. The source 40 and the drain 42 have respective source and drain extensions 46 and 48. The body includes a surface channel region 50 operatively coupled to the source 46 and the drain 48. As is conventional, the body 38 is primarily of different conductivity semiconductor material than the source 40 and the drain 42. For instance, the body 38 may be P-conductivity silicon while the source 40 and the drain 42 may be N-conductivity silicon. Alternatively, the body 38 may be N-conductivity silicon while the source 40 and the drain 42 may be P-conductivity silicon. As shown in FIG. 1, the source 40 and the drain 42 may both extend from a top surface of the active region 24 to a bottom surface of the active region.

The body 38, the source 40, and the drain 42, are operatively coupled with the gate 22 to function as a transistor. The source 40 and the drain 42 have respective source and drain electrically-conducting metal-semiconductor compound regions 54 and 56 (also referred to as "silicide regions"), to facilitate electrical connection to the source and drain. The gate electrode 28 likewise may includes an upper conductive portion 60 to facilitate electrical connection.

The active region 24 is laterally isolated from other structures of the device 10 by insulator-filled trenches (not shown) on opposite sides of the active region. The insulator-filled trenches may be trenches filled with silicon dioxide ($SiO_2$) using known shallow trench isolation (STI) techniques.

The device 10 includes a source-side metal connect 80 and a drain-side metal connect 82 on respective opposite sides of the active region 24. The metal connects 80 and 82 pass through a dielectric layer 86.

The source-side metal connect 80 is in contact with a side surface 90 of the source 40 all the way down to the insulator layer 20. Thus the source-side metal connect 80 is electrically connected to the source 40, and in particular to the source silicide region 54. Similarly, the drain-side metal connect 82 is in direct contact with a side surface 92 of the drain 42 all the way down to the insulator layer 20. Thus the drain-side metal connect 82 is electrically connected to the drain 42, and in particular to the drain silicide region 56.

The source-side metal connect 80 also has a protruding portion 94 which is between the semiconductor layer 18 and the insulator layer 20. In particular, a part of the protruding portion 94 is between the active layer 24 and the underlying portion of the semiconductor layer 20. This part of the protruding portion 94 is in direct contact with a bottom surface (underside) 98 of the active region 24, in particular with the bottom surfaces of both the source 40 and the body 38. Thus the source-side metal connect 80 is electrically connected to the body 38, and electrically couples the body 38 to the source 40. The electrical connection to the body 38 reduces the tendency of the body to build up a floating body potential, and thus reduces floating body effects in the transistor 14. The protruding portion 94 is not in contact with the semiconductor substrate 16.

The connects 80 and 82 may be made of a conductive metal, such as tungsten. It will be appreciated that alternatively the connects 80 and 82 may be made of one or more of a variety of other suitable conductive materials.

It will be appreciated that many variants on the above-described structure of the metal connects 80 and 82 are possible. For example, one or both of the metal connects 80 and 82 may be in contact with a top surface of the active region 24. As another example, the drain-side connect 82 may be in contact with only a part of the drain side surface 92, and/or may be in contact with a top surface of the drain 42. The protruding portion 94 of the source-side metal connect 80 may be asymmetric about the remainder of the source-side metal contact.

Figure 2:
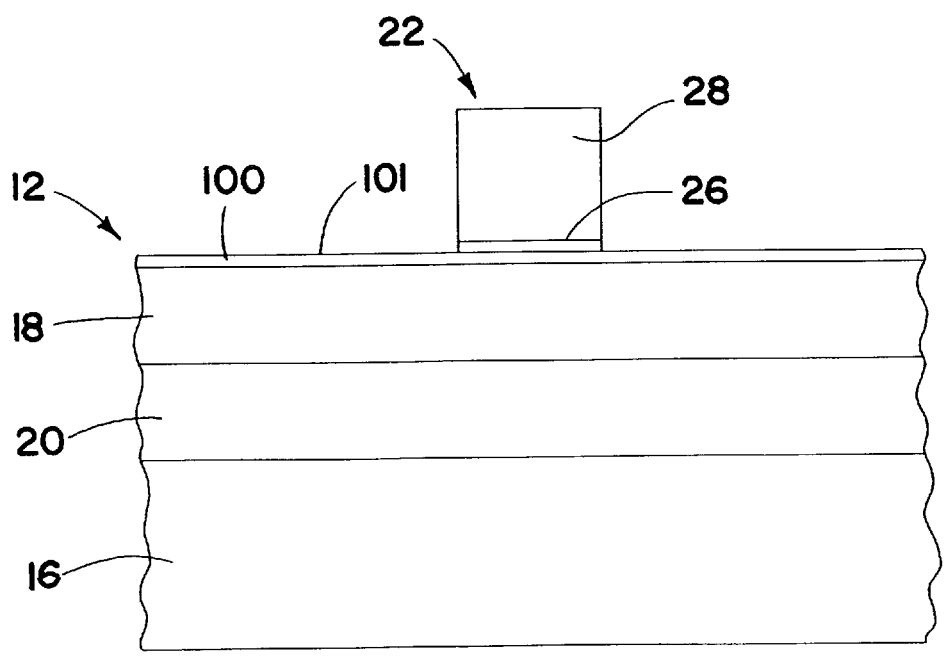
FIGS. 2–10 are cross-sectional views of various steps in a method of fabricating the semiconductor device of FIG. 1.

Various steps in the fabrication of the above-described semiconductor device 10 are illustrated in FIGS. 2–10. Referring initially to FIG. 2, starting initially with the SOI wafer 12, a light doping of the surface semiconductor layer 18 is performed to create a channel-doped surface layer 100. It will appreciated that the channel doping may be omitted if it is not required for controlling the threshold voltage of the resulting device. Then, also as shown in FIG. 2, the gate 22 is formed on the SOI wafer 12. The gate 22, including the gate dielectric 26 and the gate electrode 28, may be formed through well-known processes such as deposition of material, for example using low pressure chemical vapor deposition (LPCVD), followed by selective removal through well known processes such as lithographic processes.

Insulator-filled trenches may then be created in the SOI wafer 12 to define and laterally isolated the active region 24 of the surface semiconductor layer 18. The insulator-filled trenches may be formed using conventional well-known shallow trench isolation (STI) techniques. An exemplary process for forming an insulating trench includes forming a thin layer of oxide, approximately 150–200 Angstroms thick, on the wafer surface 101 and a top surface of the gate 22, and forming a silicon nitride mask thereon. The mask covers and protects the substrate in the area where the active region 24 are to be formed while leaving exposed the area where the insulator-filled trenches are to be formed.

Thereafter, the unmasked portions of the semiconductor surface layer 18 (e.g. the portions where the silicon nitride mask has been etched away) are etched away to form an open trench extending at least past the upper surface of the buried insulator layer 20. The etching process for a silicon substrate is typically an anisotropic dry etch using hydrogen bromide (HBr) which has selectivity characteristics such that it etches the silicon substrate but not the silicon nitride mask.

The open trench is filled by depositing silicon dioxide (SiO$_2$), formed by a chemical reaction involving SiH$_4$ or TEOS, to form insulating trenches 82 and 84. After filling the open trench the surface of the wafer is polished using a chemical mechanical polish to remove any excess silicon dioxide layer and the remaining silicon nitride mask.

It will be appreciated that the trenching may be performed at another point in the process, either earlier or later, if desired.

Figure 3:
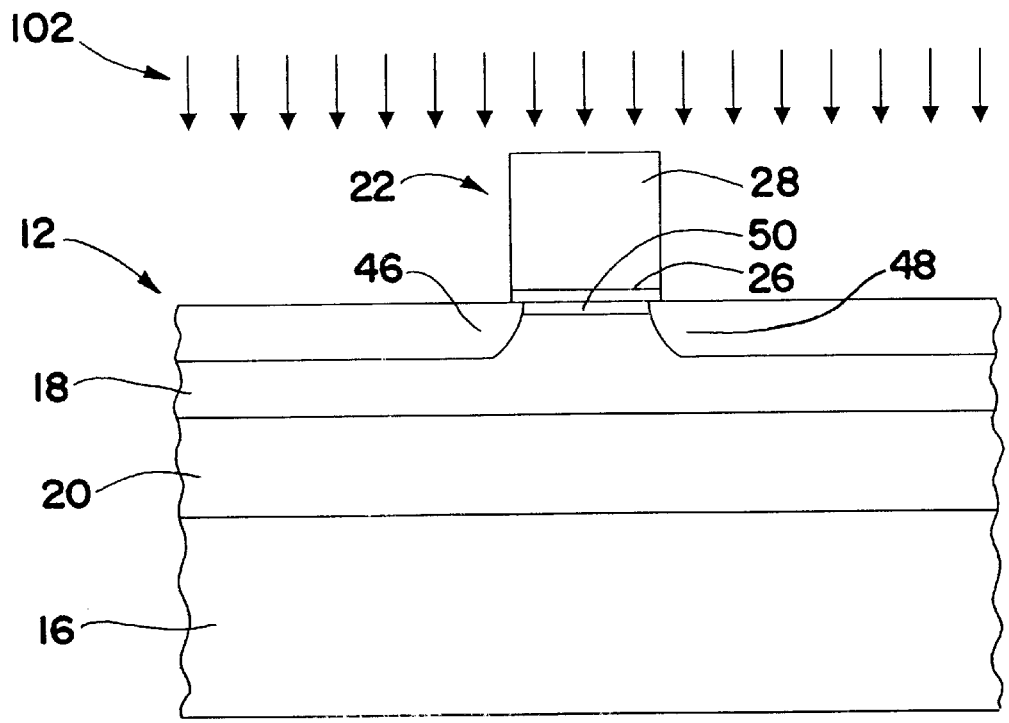
Figure 4:
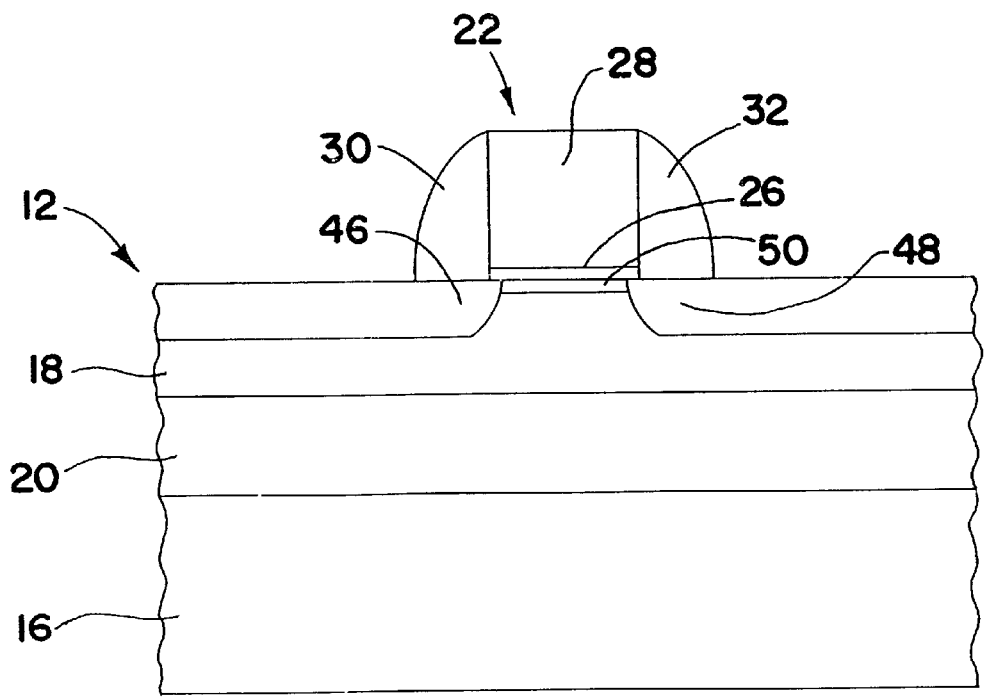
Figure 5:
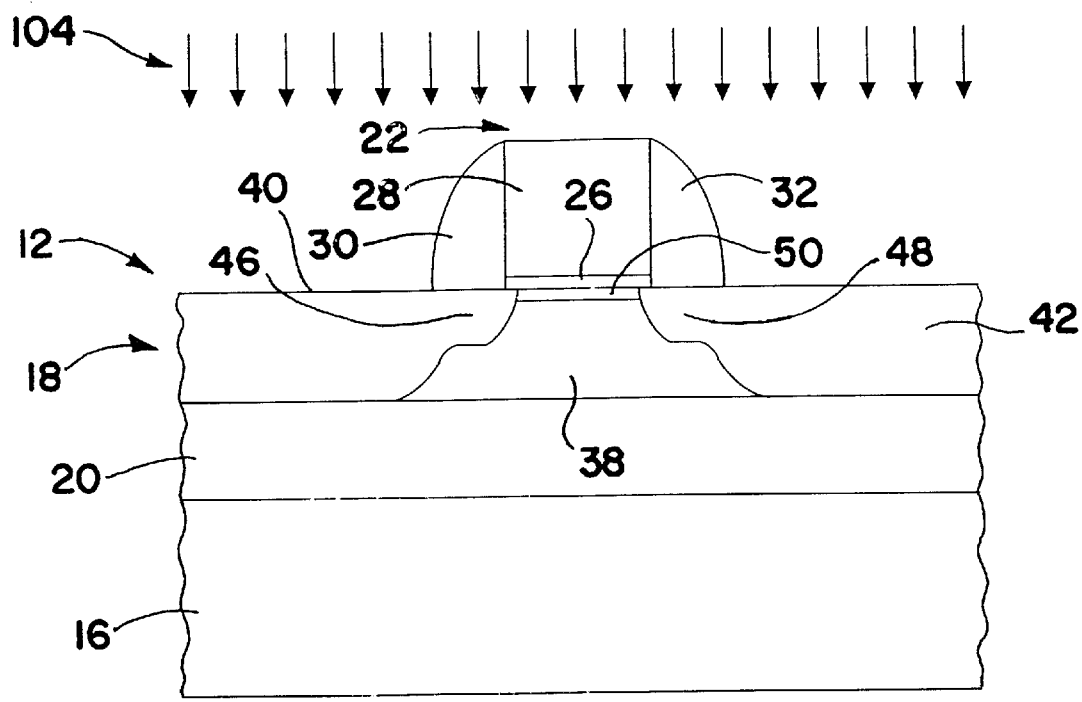

Thereafter, as illustrated in FIGS. 3–5, well-known suitable means are employed for formation of the source 40 and the drain 42. Portions of the silicon on opposing sides of the channel regions that are not masked by the gate 22 then may be doped to produce the source 40 and the drain 42. Such doping may be formed in a two-step doping process, with a low-energy doping 102 (FIG. 3) to create the extensions 46 and 48, followed by formation of the spacers 30 and 32 (FIG. 4), and then a high-energy doping 104 (FIG. 5) to create the remainder of the source 40 and the drain 42. Because the ions cannot penetrate the gate 22, the gate effectively operates as a doping mask, protecting the region of the semiconductor layer 18 underneath the gate from doping.

To form the spacers 30 and 32, a conformal dielectric layer (e.g., SiN) may be deposited on the SOI wafer 12 and on the gate 22. Parts of the dielectric layer are then selectively removed to leave respective gate source-side and drain-side spacers 30 and 32. The deposit of the dielectric material and its selective removal may be accomplished by conventional means, for example chemical vapor deposition (CVD) such as LPCVD or plasma enhanced chemical vapor deposition (PECVD), of silicon dioxide, followed by anisotropic etching using suitable, well-known etchants, an exemplary etchant being CHF$_3$.

Alternatively tilted implants may be used to form the source extension 46 and the drain extension 48.

Figure 6:
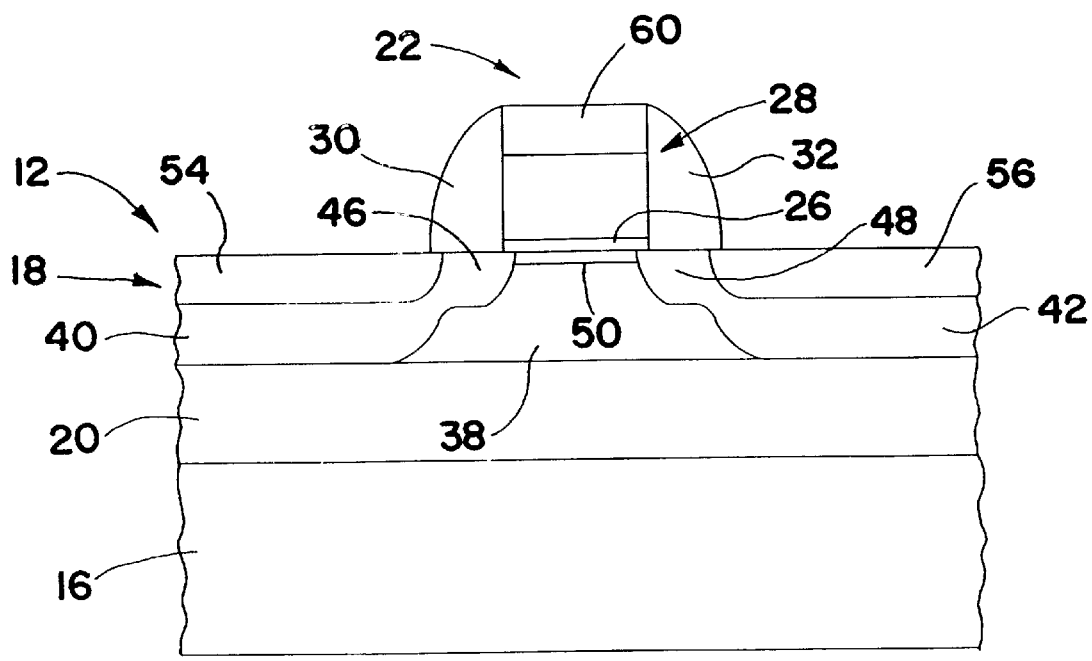

Turning now to FIG. 6, the silicide regions 54 and 56 are then formed. Silicidation may then be accomplished as follows. A layer of metal is deposited upon the gate 22, the spacers 30 and 32, and the exposed portions of the surface semiconductor layer 18. The metal layer may be of a metal such as titanium, cobalt, or nickel, which is suitable for forming a conducting compound, such as a silicide, with the semiconductor material. The metal layer may be deposited, for example, by sputtering.

Then a compound such as a silicide is formed between the metal of the metal layer and the exposed portions of the surface semiconductor layer 18. Suitable methods for formation of such electrically-conducting compounds (e.g., silicidation) are well known, an exemplary method being raising temperature of the semiconductor device 10 to a suitable level for a suitable length of time (annealing). An exemplary temperature is between about 500 and 700° C., and an exemplary suitable length of time is between 10 seconds and 10 minutes. Rapid thermal annealing (RTA) may also be employed, for example subjecting the semiconductor device 10 to a temperature between 600 and 900° C. for about 5 to 120 seconds. It will be appreciated that other temperatures and heating times may be employed. Finally, excess metal of the metal layer is removed by conventional, well-known means.

Figure 7:
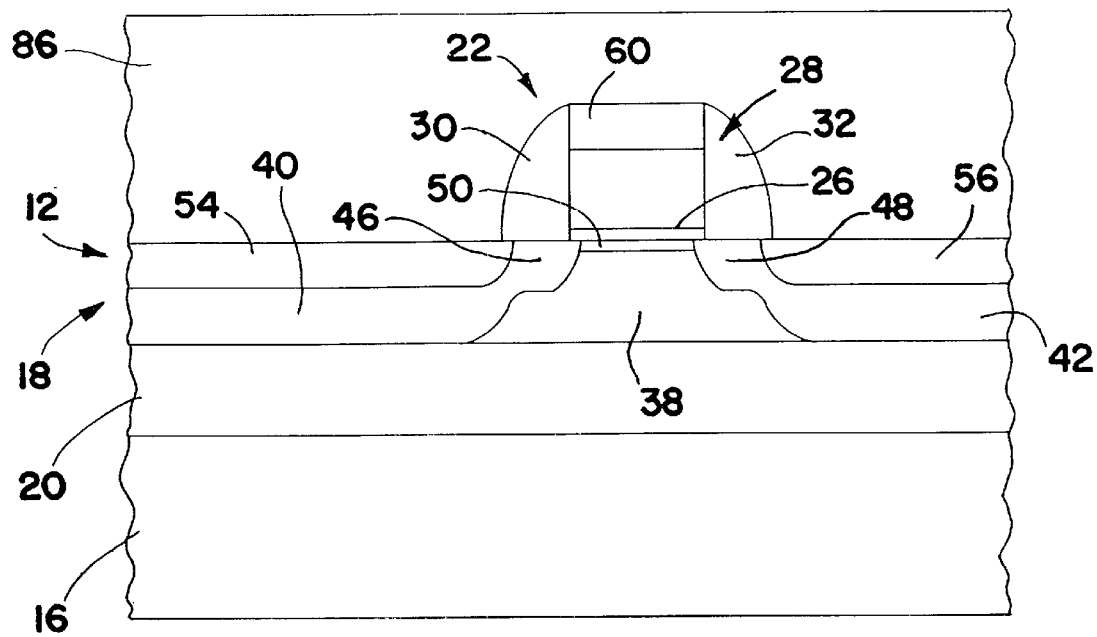

As illustrated in FIG. 7, the dielectric layer 86 is deposited and planarized. This may occur first by deposition of a layer of insulator material, for example silicon nitride, by a process such as CVD. Then well-known chemical-mechanical polishing (CMP) processes may be employed to planarize the surface of the layer.

Figure 8:
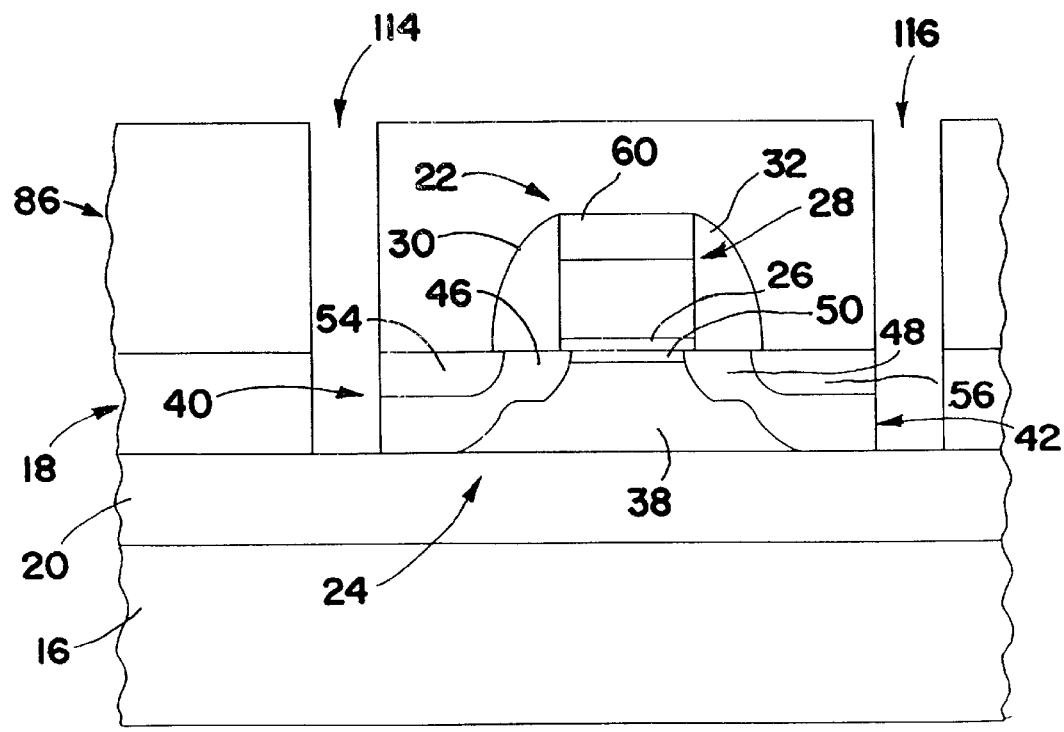

Then, as shown in FIG. 8, openings 114 and 116 are etched into the dielectric layer 86 and the surface semiconductor layer 18, to allow access to the sides 90 and 92 of the active region 24, and to a portion of the insulator layer 20. The etching to form the openings 114 and 116 may include one or more dry etch processes such as plasma etching, ion milling, reactive ion beam etching, and/or may include other processes suitable for carrying out the invention.

Figure 9:
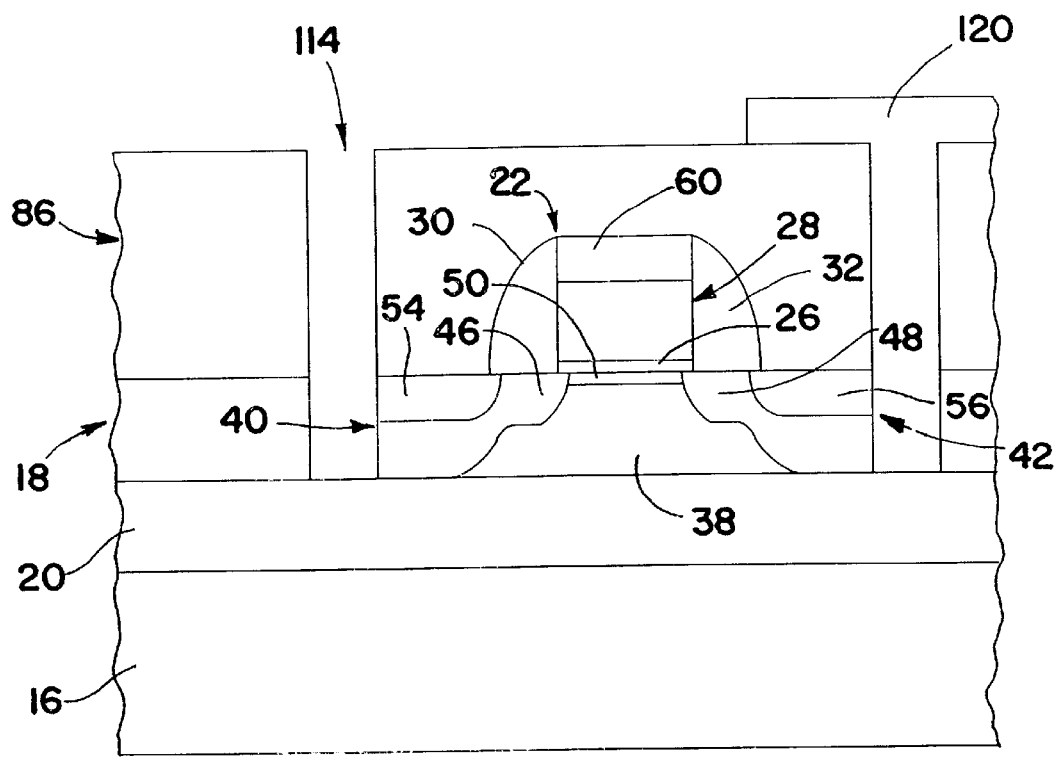

Referring now to FIG. 9, a mask element 120 is created to mask off the opening 116 for the subsequent etching step shown in FIG. 10 and described below. The mask element 120 may be performed by well-known lithographic processes such as photolithography—a layer of resist material such as photoresist may be deposited; then the photoresist may be selectively exposed, with the exposed or unexposed photoresist removed to leave the mask element 120. It will be appreciated that other suitable methods for forming the mask element 120 may be employed.

Figure 10:
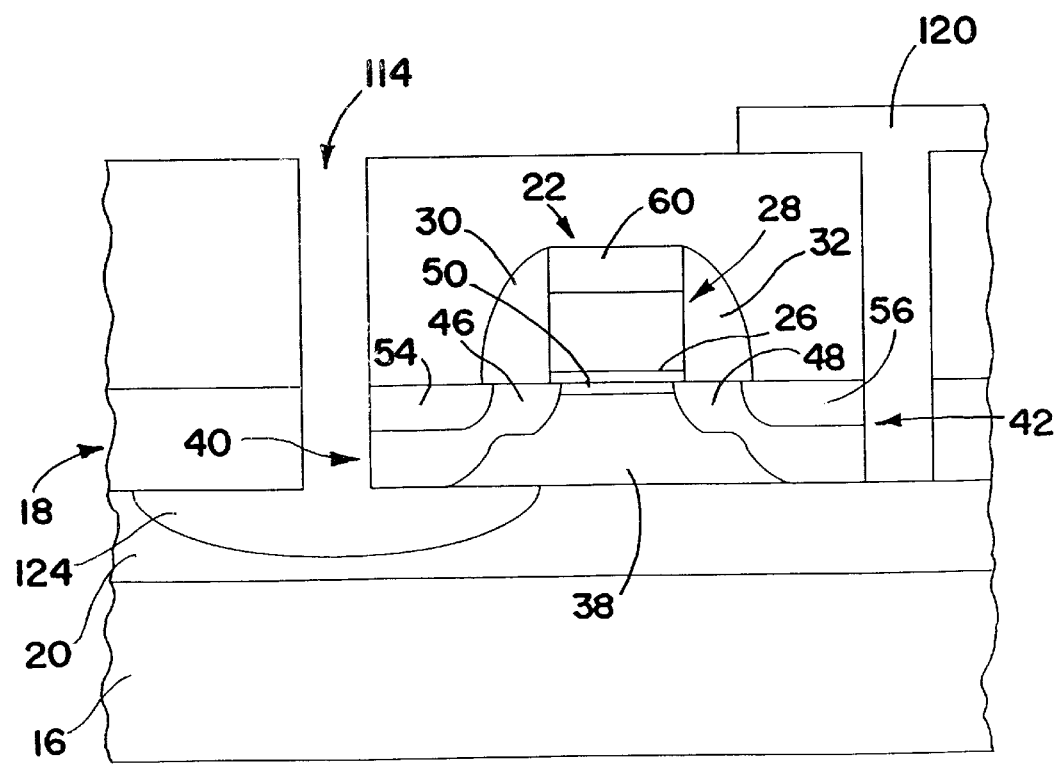

As shown in FIG. 10, etching is used to form a hollow 124 in the insulator layer 20. The etching is performed through the opening 114, and may include lateral or isotropic etching of the insulator layer 20. An example of a suitable etchant is HF. It will be appreciated that the exposed side surfaces of the opening 114 may have a material deposited on them that is resistant to the etchant.

Following the etching to create the hollow 124, the mask element 120 is removed, for example by use of well-known solvents for stripping photoresist, and the metal connects 80 and 82 are then formed. The connects 80 and 82 may be formed by a metal deposition process, for example by chemical vapor deposition (CVD). The resulting structure is that shown in FIG. 1 and described above.

It will be appreciated that the above-described structure and method are only exemplary, and that many suitable variations may be employed. For example, the semiconductor material may be silicon or another suitable semiconductor material. It may be possible to substitute oxides for nitrides, and/or vice versa, in the above structure and/or in the above fabrication method.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A semiconductor-on-insulator (SOI) device comprising:
   a semiconductor substrate;
   an insulator layer over the semiconductor substrate;
   an active semiconductor region over the insulator layer, the active semiconductor region including a source, a drain, and a body between the source and the drain; and
   a metal connector, wherein part of the metal connector is directly in contact with the body and is interposed between the insulator layer and at least part of the body;

wherein the metal connector is also directly in contact with the source; and wherein the metal connector is directly in contact with a bottom surface of the source.

2. A semiconductor-on-insulator (SOI) device comprising:
- a semiconductor substrate;
- an insulator layer over the semiconductor substrate;
- an active semiconductor region over the insulator layer, the active semiconductor region including a source, a drain, and a body between the source and the drain; and
- a metal connector, wherein part of the metal connector is directly in contact with the body and is interposed between the insulator layer and at least part of the body;
- wherein the source extends from a top surface of the semiconductor region to a bottom surface of semiconductor region.

3. The device of claim 2, wherein the substrate and the active region are made of silicon.

4. The device of claim 2, wherein the metal connector is made of tungsten.

5. The device of claim 2, wherein the source includes a source suicide region, and wherein the metal connector is directly In contact with the source suicide region.

6. The device of claim 2, wherein the metal connector is not in contact with the substrate.

7. A semiconductor-on-insulator (SOI) device comprising:
- a semiconductor substrate;
- an insulator layer over the semiconductor substrate;
- an active semiconductor region over the insulator layer, the active semiconductor region including a source, a drain, and a body between the source and the drain;
- a metal connector, wherein part of the metal connector is directly in contact with the body and is interposed between the insulator layer and at least part of the body; and
- another metal connector directly in contact with a side surface of the drain.

8. The device of claim 7 wherein the another metal connector is also directly in contact with the insulator layer.

9. A semiconductor-on-insulator (SOI) device comprising:
- a semiconductor substrate;
- an Insulator layer over the semiconductor substrate;
- an active semiconductor region over the insulator layer, the active semiconductor region including a source, a drain, and a body between the source and the drain, wherein the source extends from a top surface of the active semiconductor region to a bottom surface of the active semiconductor region; and
- a metal connector, wherein part of the metal connector is directly in contact with the source and the body along the bottom surface of the active semiconductor region, and wherein the metal connector is not in contact with the substrate.

10. The device of claim 9, wherein part of the metal connector is directly in contact with the body, and is interposed between the insulator layer and at least part of the body.

11. The device of claim 10, wherein the insulator layer and the part of the metal connector have a curved interface therebetween.

12. The device of claim 9, further comprising another metal connector directly in contact with a side surface of the drain.

13. The device of claim 12, wherein the another metal connector is also directly in contact with the insulator layer.

14. A semiconductor-on-insulator (SOI) device comprising:
- a semiconductor substrate;
- an insulator layer over the semiconductor substrate;
- an active semiconductor region over the insulator layer, the active semiconductor region including a source, a drain, and a body between the source and the drain; and
- a metal connector, wherein part of the metal connector is directly in contact with the body and is interposed between the insulator layer and at least part of the body,
- wherein the insulator layer and the part of the metal connector have a curved interface therebetween.

15. The device of claim 14, wherein the metal connector is also directly in contact with the source.

16. The device of claim 15, wherein the metal connector is directly in contact with a side surface of the source.

17. The device of claim 14, wherein the part of the metal connector is directly in contact with a bottom surface of the source.

18. A semiconductor-on-Insulator (SOI) device comprising:
- a semiconductor substrate;
- an insulator layer over the semiconductor substrate;
- an active semiconductor region over the insulator layer, the active semiconductor region including a source, a drain, and a body between the source and the drain; and
- a metal connector;
- wherein the source extends from a top surface of the active semiconductor region to a bottom surface of the active semiconductor region;
- wherein a part of the metal connector is directly in contact with the source and the body along the bottom surface of the active semiconductor region;
- wherein the part of the metal connector is interposed between the insulator layer and at least part of the body;
- wherein the metal connector is not in contact with the substrate; and
- wherein the insulator layer and the part of the metal connector have a curved interface therebetween.

19. The device of claim 18, wherein the metal connector is also directly in contact with a side surface of the source.

* * * * *

UNITED STATES PATENT AND TRADEMARK OFFICE
CERTIFICATE OF CORRECTION

PATENT NO. : 6,441,435 B1
DATED : August 27, 2002
INVENTOR(S) : Chan

It is certified that error appears in the above-identified patent and that said Letters Patent is hereby corrected as shown below:

Column 7,
Line 17, before "semiconductor region" insert -- active --
Line 17, after "surface of" insert -- the active --
Line 25, replace "In" with -- in --
Line 25, replace "suicide" with -- silicide --
Line 47, replace "Insulator" with -- insulator --

Column 8,
Line 34, replace "Insulator" with -- insulator --

Signed and Sealed this

Twenty-eighth Day of January, 2003

JAMES E. ROGAN
*Director of the United States Patent and Trademark Office*